United States Patent
Yoshioka et al.

(10) Patent No.: US 10,074,739 B2
(45) Date of Patent: Sep. 11, 2018

(54) SEMICONDUCTOR DEVICE HAVING ELECTRIC FIELD NEAR DRAIN ELECTRODE ALLEVIATED

(71) Applicant: KABUSHIKI KAISHA TOSHIBA, Tokyo (JP)

(72) Inventors: Akira Yoshioka, Kanazawa Ishikawa (JP); Kohei Oasa, Nonoichi Ishikawa (JP); Hung Hung, Nonoichi Ishikawa (JP); Yasuhiro Isobe, Kanazawa Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/243,828

(22) Filed: Aug. 22, 2016

(65) Prior Publication Data

US 2017/0271495 A1 Sep. 21, 2017

(30) Foreign Application Priority Data

Mar. 15, 2016 (JP) .................................. 2016-051417

(51) Int. Cl.
*H01L 29/04* (2006.01)
*H01L 29/10* (2006.01)
(Continued)

(52) U.S. Cl.
CPC ...... *H01L 29/7787* (2013.01); *H01L 29/0692* (2013.01); *H01L 29/2003* (2013.01);
(Continued)

(58) Field of Classification Search
CPC .................. H01L 29/7787; H01L 29/205
(Continued)

(56) References Cited

U.S. PATENT DOCUMENTS 7,566,917 B2 * 7/2009 Twynam ............... H01L 29/405
257/183
8,680,580 B2 3/2014 Ota
(Continued)

FOREIGN PATENT DOCUMENTS

JP 4473201 B2 6/2010
JP 2013191759 A 9/2013
(Continued)

OTHER PUBLICATIONS

Japanese Office Action dated May 22, 2018, filed in counterpart Japanese Patent Application No. 2016-051417 (12 pages)(with translation).

*Primary Examiner* — Jami M Valentine
(74) *Attorney, Agent, or Firm* — Patterson & Sheridan, LLP (57) ABSTRACT

A semiconductor device includes a first nitride semiconductor layer, a second nitride semiconductor layer containing aluminum located on the first nitride semiconductor layer, one or more nitride layers containing aluminum located on the second nitride semiconductor layer, a source electrode located on the second nitride semiconductor layer, a drain electrode located on one of the second nitride semiconductor layer or the nitride layer, and a gate electrode located between the source electrode and the drain electrode. An end of the nitride layer on the source electrode side thereof is located between the gate electrode and the drain electrode.

12 Claims, 8 Drawing Sheets

(51) Int. Cl.
  *H01L 29/778* (2006.01)
  *H01L 29/20* (2006.01)
  *H01L 29/205* (2006.01)
  *H01L 29/207* (2006.01)
  *H01L 29/06* (2006.01)
  *H01L 29/66* (2006.01)

(52) U.S. Cl.
  CPC .......... *H01L 29/205* (2013.01); *H01L 29/207* (2013.01); *H01L 29/66462* (2013.01)

(58) Field of Classification Search
  USPC ..................................... 257/49, 76; 438/149
  See application file for complete search history.

(56) References Cited

U.S. PATENT DOCUMENTS

| | | | |
|---|---|---|---|
| 2013/0248873 A1* | 9/2013 | Kuraguchi ............ | H01L 29/812 257/76 |
| 2014/0117375 A1* | 5/2014 | Isobe .................. | H01L 29/7783 257/76 |
| 2015/0076506 A1* | 3/2015 | Yasumoto ........... | H01L 29/2003 257/76 |

FOREIGN PATENT DOCUMENTS

| | | |
|---|---|---|
| JP | 2013-229458 A | 11/2013 |
| JP | 5801560 B2 | 10/2015 |
| WO | 2009/066434 A1 | 5/2009 |

* cited by examiner

SEMICONDUCTOR DEVICE HAVING ELECTRIC FIELD NEAR DRAIN ELECTRODE ALLEVIATED

CROSS-REFERENCE TO RELATED APPLICATION

This application is based upon and claims the benefit of priority from Japanese Patent Application No. 2016-051417, filed Mar. 15, 2016, the entire contents of which are incorporated herein by reference.

FIELD

Embodiments described herein relate generally to a semiconductor device.

BACKGROUND

When a horizontally-structured nitride semiconductor device is turned off, a two dimensional electron gas previously formed therein below the gate electrode is depleted. At this time, when a drain voltage is high, in some cases, a depletion layer extends up to the drain electrode. In this case, an electric field concentrates at the drain electrode, and there is a high likelihood that an element will be damaged.

DETAILED DESCRIPTION

One embodiment provides a semiconductor device that is capable of alleviating an electric field concentration at a drain electrode.

In general, according to one embodiment, a semiconductor device includes a first nitride semiconductor layer, a second nitride semiconductor layer containing aluminum located on the first nitride semiconductor layer, a nitride layer containing aluminum located on the second nitride semiconductor layer, a source electrode located on the second nitride semiconductor layer, a drain electrode located on one of the second nitride semiconductor layer or the nitride layer, and a gate electrode located between the source electrode and the drain electrode. An end of the nitride layer on the source electrode side thereof is located between the gate electrode and the drain electrode.

Embodiments are described below referring to the drawings. The present embodiment is not intended to restrict the embodiments to the exemplary embodiment.

First Embodiment

Figure 1:
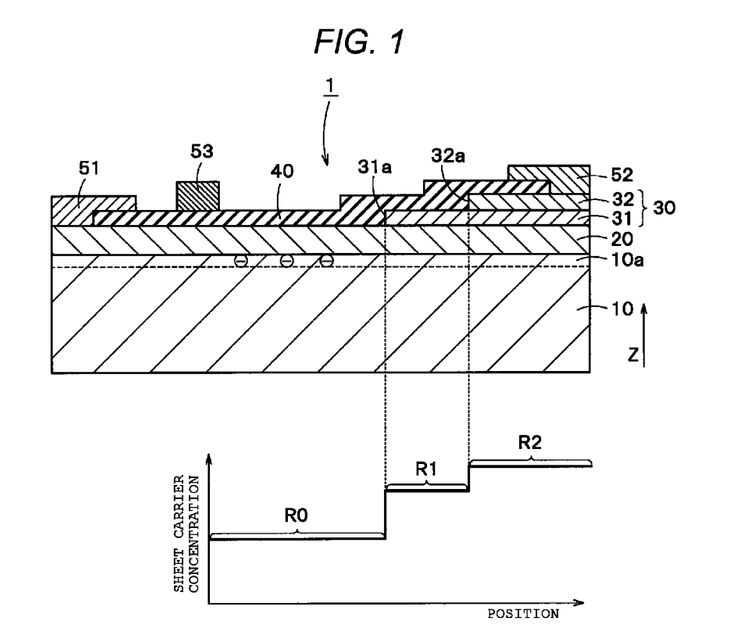
FIG. 1 is a cross-sectional diagram illustrating a schematic structure of a semiconductor device according to a first embodiment.

FIG. 1 is a cross-sectional diagram illustrating a schematic structure of a semiconductor device according to a first embodiment. As illustrated in FIG. 1, a semiconductor device 1 according to the present embodiment includes nitride semiconductor layers 10 to 30, an insulating film 40, a source electrode 51, a drain electrode 52, and a gate electrode 53. The nitride semiconductor layer 10 is equivalent to a first nitride semiconductor layer, and a nitride semiconductor layer 20 is equivalent to a second nitride semiconductor layer.

The nitride semiconductor layer 10 is provided on a silicon substrate (not illustrated) via a buffer layer (not illustrated). The nitride semiconductor layer 10, for example, includes an undoped gallium nitride (GaN). The nitride semiconductor layer 20 is provided on the nitride semiconductor layer 10.

The nitride semiconductor layer 20 is undoped aluminum gallium nitride (AlGaN). The aluminum percentage of the nitride semiconductor layer 20 is approximately 20%. Furthermore, the thickness of the nitride semiconductor layer 20 is approximately 25 nm. Additionally, the band gap of the nitride semiconductor layer 20 is greater than a band gap of the nitride semiconductor layer 10. A two-dimensional electron gas 10a occurs at and adjacent to the interface between the nitride semiconductor layer 10 and the nitride semiconductor layer 20.

A nitride layer 30 includes a first nitride layer 31 located on the nitride semiconductor layer 20, and a second nitride layer 32 stacked on, i.e., formed over, the first nitride layer 31. Moreover, the nitride layer 30 may be a single layer and include three or more layers.

The first nitride layer 31 is undoped aluminum nitride gallium. According to the present embodiment, the aluminum percentage of the first nitride layer 31 is approximately 25%. Furthermore, the thickness of the first nitride layer 31 is approximately 10 nm. Additionally, in order to form a region R1 (refer to FIG. 1) having a high sheet carrier concentration of the two-dimensional electron gas 10a, the end 31a of the first nitride layer 31 on the source electrode 51 side thereof is located between the gate electrode 53 and the drain electrode 52.

The second nitride layer 32 is also undoped aluminum gallium nitride. The aluminum percentage of the second nitride layer 32 is approximately 30%. Furthermore, the thickness of the second nitride layer 32 is approximately 5 nm. Additionally, to form a region R2 (refer to FIG. 1) having a higher sheet carrier concentration than the region R1, the end 32a of the second nitride layer 32 on the source electrode 51 side thereof is located closer to the drain electrode 52 than is the end 31a.

Moreover, the undoped layer described above is film-formed without intentional doping thereof with impurities, and is not a layer into which impurities are diffused from a higher layer or a lower layer during heat treatment or the like after the layer is formed or in a further manufacturing process. More precisely, the undoped layer is assumed to have impurity concentration of less than $1 \times 10^{16}/cm^3$.

The insulating film 40 is located on the nitride semiconductor layer 20 and the nitride layer 30. The insulating film 40, for example, is formed using silicon nitride (SiN). The gate electrode 53 is located on the insulating film 40.

The gate electrode 53 is disposed between the source electrode 51 and the drain electrode 52. The source electrode 51 is located in part on the nitride semiconductor layer 20. The drain electrode 52 is provided in part on the second nitride layer 32.

The sheet carrier concentration of the two-dimensional electron gas 10a between the gate electrode 53 and the drain electrode 52 of the semiconductor device 1 constituted as described above is now described.

As illustrated in FIG. 1, the sheet carrier concentration of the region R1 in which the first nitride layer 31 is located on the nitride semiconductor layer 20 is higher than the sheet carrier concentration of a region R0 in which the first nitride layer 31 is not provided. Additionally, the sheet carrier concentration of the region R2 in which the first nitride layer 31 and the second nitride layer 32 are both located on the nitride semiconductor layer 20 is higher than the sheet carrier concentration of the region R1. That is, in the semiconductor device 1, the sheet carrier concentration increases in a stepwise manner from the gate electrode 53 in the direction of the drain electrode 52.

A process of manufacturing the semiconductor device 1 according to the present embodiment will be described below referring to FIGS. 2 to 7.

Figure 2:
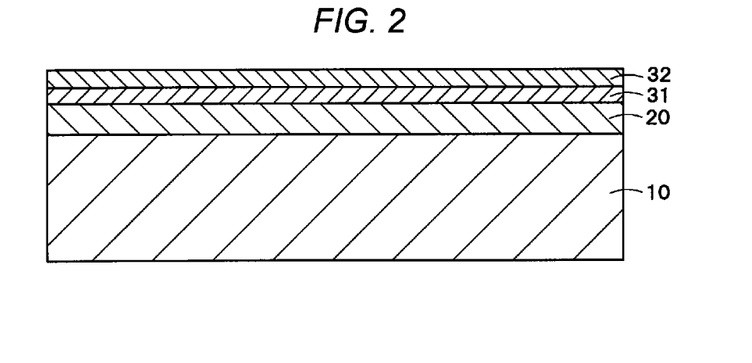
FIG. 2 is a cross-sectional diagram illustrating a process of manufacturing the semiconductor device that is illustrated in FIG. 1.

First, as illustrated in FIG. 2, the nitride semiconductor layer 10, the nitride semiconductor layer 20, the first nitride layer 31, and the second nitride layer 32, for example, are formed by epitaxial growth using a metal organic chemical vapor deposition (MOCVD) method.

Figure 3:
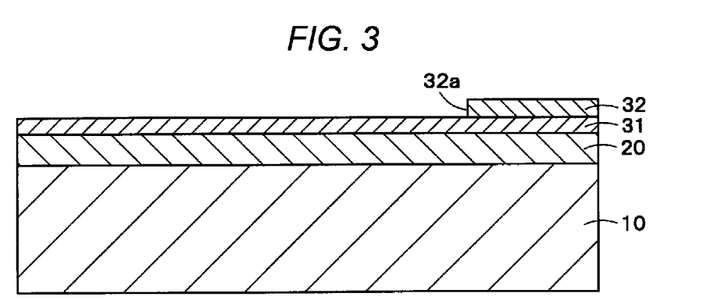
FIG. 3 is a cross-sectional diagram illustrating a manufacturing process that follows the manufacturing processing which is illustrated in FIG. 2.

Next, as illustrated in FIG. 3, a portion of the second nitride layer 32 is removed, for example, with a chlorine-based gas using a reactive ion etching (RIE) method.

Figure 4:
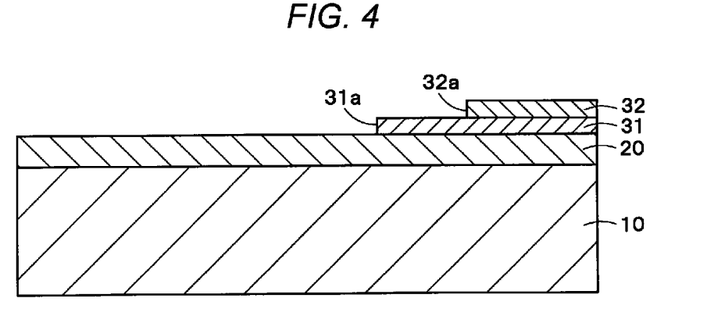
FIG. 4 is a cross-sectional diagram illustrating a manufacturing process that follows the manufacturing processing which is illustrated in FIG. 3.

Thereafter, as illustrated in FIG. 4, a portion of the first nitride layer 31 is removed as well, for example, with the chlorine-based gas using the reactive ion etching method (RIE). At this time, the first nitride layer 31 is removed in such a manner that the end 31a is located closer to the left of the end 32a in FIG. 4, i.e., a portion of the first nitride layer extends outwardly from the end 32a of the second nitride layer 32.

Figure 5:
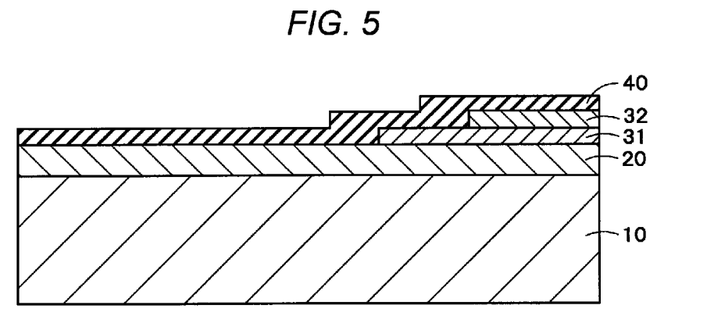
FIG. 5 is a cross-sectional diagram illustrating a manufacturing process that follows the manufacturing processing which is illustrated in FIG. 4.

Thereafter, as illustrated in FIG. 5, the insulating film 40 is formed the exposed upper surface of each of the nitride semiconductor layer 20, the first nitride layer 31 and the second nitride layer 32, using for example, using a plasma enhancement chemical vapor deposition (PECVD) method or a low pressure chemical vapor deposition (LPCVD) method.

Figure 6:
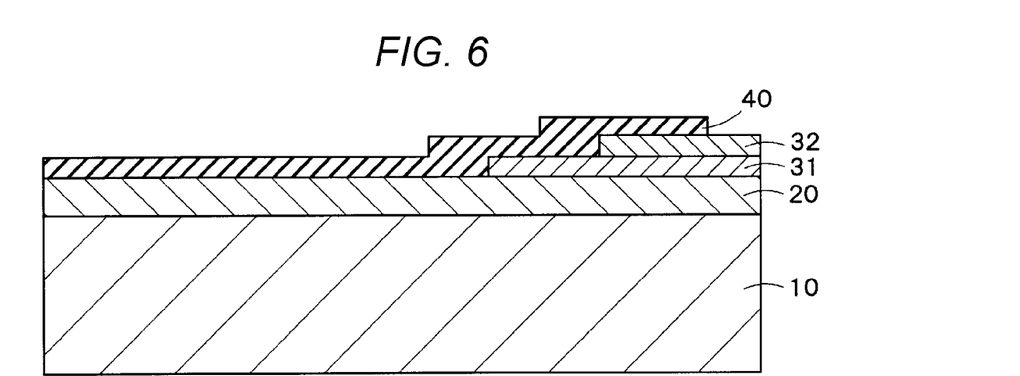
FIG. 6 is a cross-sectional diagram illustrating a manufacturing process that follows the manufacturing processing which is illustrated in FIG. 5.

Thereafter, as illustrated in FIG. 6, an end portion of the insulating film 40 overlying the second nitride layer 32 is removed by wet etching or dry etching. Accordingly, a portion of the nitride layer 32 is exposed. Likewise, a portion of the insulating film 40 overlying only the second nitride semiconductor layer 20 is removed by wet etching or dry etching, and accordingly, a portion of the second nitride semiconductor layer 20 is exposed.

Figure 7:
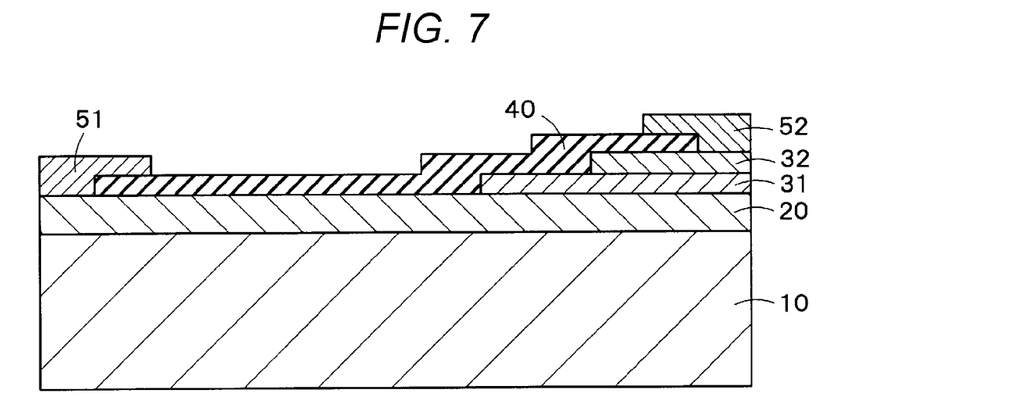
FIG. 7 is a cross-sectional diagram illustrating a manufacturing process that follows the manufacturing processing which is illustrated in FIG. 6.

Thereafter, as illustrated in FIG. 7, the source electrode 51 is formed on the exposed portion of the nitride semiconductor layer 20, and the drain electrode 52 is formed on the exposed portion of the second nitride layer 32. The source electrode 51 is in ohmic contact with the nitride semiconductor layer 20, and the drain electrode 52 is in ohmic contact with the second nitride layer 32.

Thereafter, referring back to FIG. 1, the gate electrode 53 is formed on the insulating film 40. The gate electrode 53 is located closer to the source electrode 51 than is the end 31a of the first nitride layer 31.

Operation of the semiconductor device 1 that is manufactured after going through the above-described manufacturing processes is now described. Initially, OFF operation of the semiconductor device 1 will be described.

When a negative voltage is applied between the gate electrode 53 and the source electrode 51, the semiconductor device 1 is turned off. With the OFF operation of the semiconductor device 1, a depletion layer extends from the gate electrode 53 toward the drain electrode 52.

When the depletion layer reaches the end portion 31a of the first nitride layer 31, because the sheet carrier concentration of the two-dimensional electron gas 10a is increased, further extension of the depletion layer toward the drain electrode 52 is suppressed. Thereafter, if the depletion layer reaches the end 32a of the second nitride layer 32, because the sheet carrier concentration of the two-dimensional electron gas 10a is there additionally increased, extension of the depletion layer toward the drain electrode 52 is further suppressed.

According to the present embodiment described above, because the first nitride layer 31 and the second nitride layer 32 are provided, the depletion layer has the difficulty of extending toward the drain electrode 52 side of the device. Accordingly, because the electric field concentration in an end portion of the drain electrode 52 is alleviated, reliability of the device can be improved.

Moreover, according to the present embodiment, the aluminum concentration of the nitride layer 30 is higher than the aluminum concentration of the nitride semiconductor layer 20. In other words, the band gap of the nitride layer 30 is greater than the band gap of the nitride semiconductor layer 20. However, the aluminum concentration of the nitride layer 30 may be the same as or lower than the aluminum concentration of the nitride semiconductor layer 20.

The total thickness of the nitride semiconductor layer 20 and the nitride layer 30 in each of the regions R1 and R2 is greater than in the region R0 because the nitride layer 30 is not provided in the region R0. For this reason, regardless of the aluminum concentration, the sheet carrier concentration of each of the regions R1 and R2 becomes higher than the sheet carrier concentration of the region R0.

Furthermore, according to the present embodiment, where a nitride layer in the stack of nitride layers is further from the substrate, the aluminum concentration in the nitride layer 30 becomes higher. However, as the stacking position becomes higher, the aluminum concentration may become lower. Regardless of the stack position, the aluminum concentration may also be the same. The nitride layer(s) thickness of the region R2 in which the first nitride layer 31 and the second nitride layer 32 are provided is greater than the nitride layer thickness of the region R1 in which only the first nitride layer 31 is provided. As a result, regardless of the aluminum concentration, the sheet carrier concentration of the region R2 is higher than the sheet carrier concentration of the region R1.

First Modification Example

A first modification example is described. In description, only the differences between the first embodiment and modification example are described. In the present modification example, compositions of the first nitride layer 31 and the second nitride layer 32 are different from those in the first embodiment.

The first nitride layer 31 includes silicon-doped aluminum nitride gallium. According to the present modification example, the silicon concentration of the first nitride layer 31 is 1E17 $cm^{-3}$. The second nitride layer 32 includes silicon-doped aluminum nitride gallium as well. According to the present modification example, the silicon concentration of the first nitride layer 31 is 2E17 $cm^{-3}$. That is, the silicon concentration of the second nitride layer 32 is higher than the silicon concentration of the first nitride layer 31. Furthermore, the aluminum concentration of the second nitride layer 32 is almost the same as aluminum concentration of the first nitride layer 31.

According to this modification example, by adjusting the amount of silicon doping, the sheet carrier concentration of each of the regions R1 and R2 can be increased to become greater than the sheet carrier concentration of the region R0 in the same manner as in the first embodiment. As a result, because the depletion layer has difficulty extending toward the drain electrode, the electric field concentration in the end portion of the device adjacent to the drain electrode 52 can be alleviated.

Second Modification Example

A second modification example is described. In description, only the differences between the first embodiment and modification example are described. In the present modification example, methods of manufacturing the first nitride layer 31 and the second nitride layer 32 are different from those in the first embodiment.

FIGS. 8 to 11 are cross-sectional diagrams illustrating a process of manufacturing a semiconductor device according to the second modification example. At this point, processes of manufacturing the first nitride layer 31 and the second nitride layer 32 are described. Moreover, manufacturing processes other than these manufacturing processes are the same as those in the first embodiment, and thus descriptions thereof are omitted.

Figure 8:
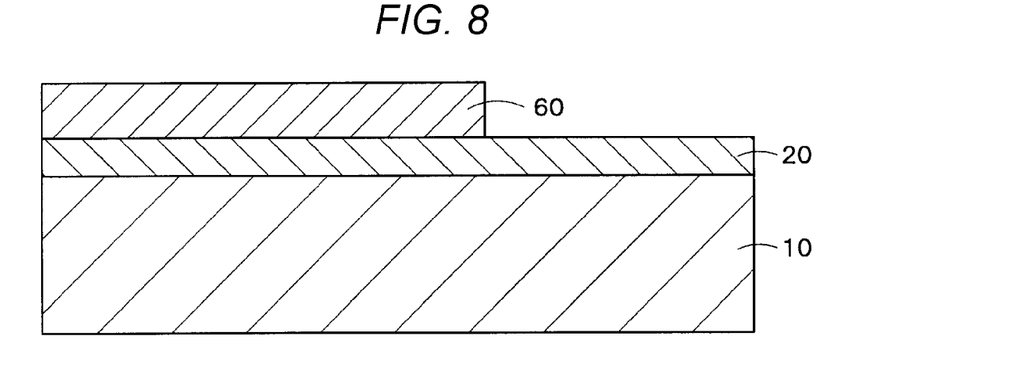
FIG. 8 is a cross-sectional diagram illustrating a processing of manufacturing a semiconductor device according to a second modification example.

First, as illustrated in FIG. 8, a silicon oxide film 60 is formed on the nitride semiconductor layer 20, for example, using the PECVD method or the RIE method. Subsequently, the first nitride layer 31 is epitaxially grown on the exposed portion of the nitride semiconductor layer 20 using the silicon oxide film 60 as a mask, and thus the first nitride layer 31 is formed.

Figure 9:
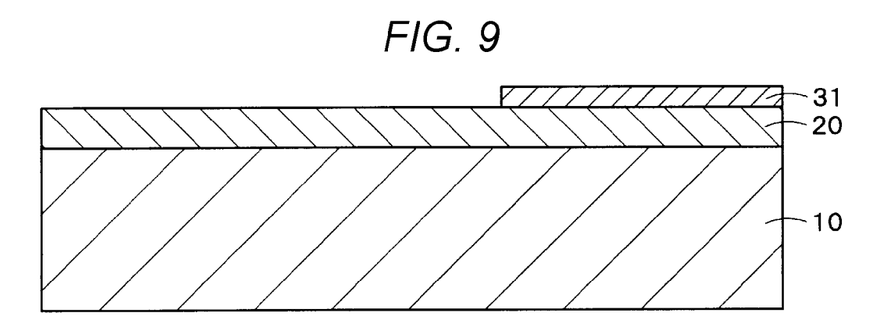
FIG. 9 is a cross-sectional diagram illustrating a manufacturing process that follows the manufacturing process which is illustrated in FIG. 8.
Figure 10:
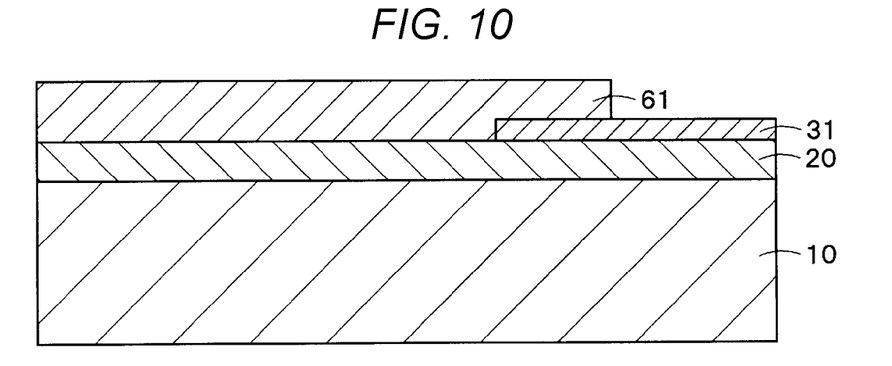
FIG. 10 is a cross-sectional diagram illustrating a manufacturing process that follows the manufacturing process which is illustrated in FIG. 9.

After the formation of the first nitride layer 31, as illustrated in FIG. 9, the silicon oxide film 60 is removed by wet etching. Thereafter, as illustrated in FIG. 10, a silicon oxide film 61 is formed on the nitride semiconductor layer 20 and the first nitride layer 31, for example, using the PECVD method and the RIE method. Subsequently, the second nitride layer 32 is epitaxially grown on the first nitride layer 31 using the silicon oxide film 61 as a mask, and thus the second nitride layer 32 is formed.

Figure 11:
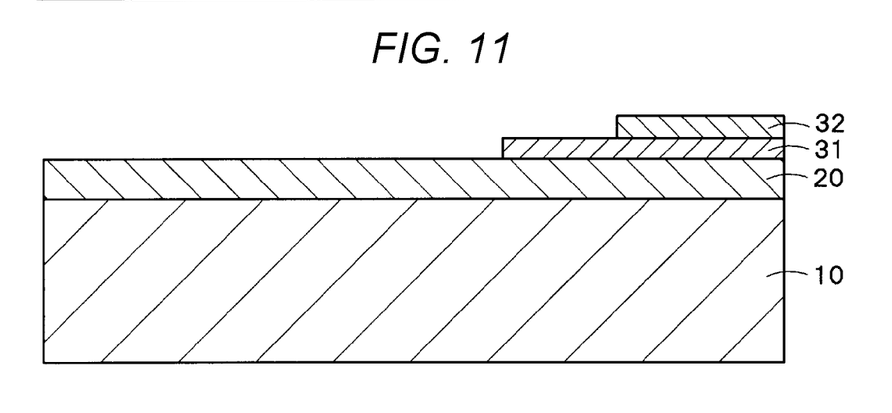
FIG. 11 is a cross-sectional diagram illustrating a manufacturing process that follows the manufacturing process which is illustrated in FIG. 10.

Then, as illustrated in FIG. 11, the silicon oxide film 61 is removed with the wet etching, and thus forming of the first nitride layer 31 and the second nitride layer 32 are completed. Moreover, subsequent manufacturing processes are the same as those in the first embodiment.

According to this modification example, the first nitride layer 31 and the second nitride layer 32 can be manufactured. For this reason, using the first nitride layer 31 and the second nitride layer 32, the extension of the depletion layer toward the drain electrode 52 is suppressed and thus the electric field concentration in the end portion of the device at the drain electrode 52 can be alleviated.

Third Modification Example

A third modification example is described. At this point, what is different from the first embodiment described above is described in a focused manner. In the present modification example, the end 31a of the first nitride layer 31 and the end 32a of the second nitride layer 32 are different in shape from those in the first embodiment.

Figure 12:
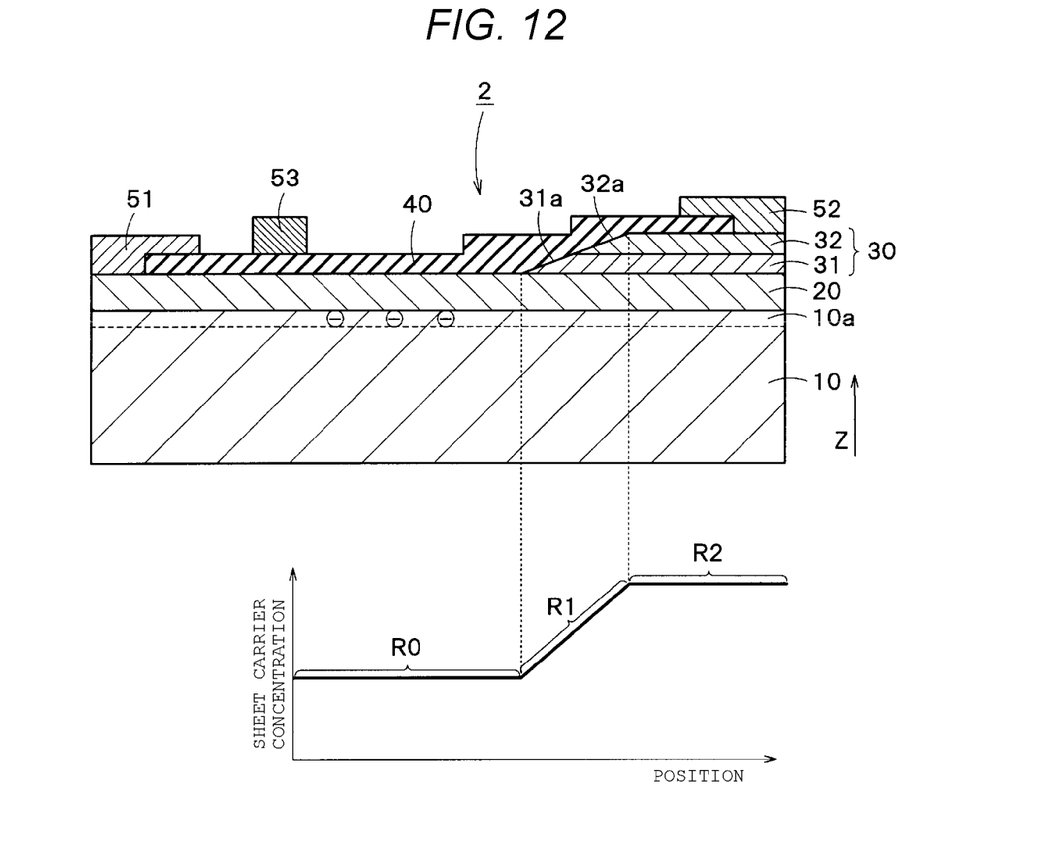
FIG. 12 is a cross-sectional diagram illustrating a schematic structure of a semiconductor device according to a third modification example.

FIG. 12 is a cross-sectional diagram illustrating a schematic structure of a semiconductor device according to the third modification example. As illustrated in FIG. 12, in the semiconductor device 2 according to the present modification example, the end 31a of the first nitride layer 31 and the end 32a of the second nitride layer 32 are formed to taper downwardly in the direction of the source electrode 51, and are thus inclined with respect to the stacking direction Z.

The sheet carrier concentration of the region R1 having the tapered ends 31a, 32b correspondingly increases with tapering inclination, i.e., total thickness of the nitride layers 31, 32. In other words, the sheet carrier concentration in the region R1 increases continuously in the direction of the drain electrode 52. For this reason, the sheet carrier concentration of the region R1 becomes higher than the sheet carrier concentration of the region R0 in which the first nitride layer 31 and the second nitride layer 32 are not provided.

In the present modification example described above, in the same manner as in the first embodiment, the first nitride layer 31 and the second nitride layer 32 can suppress the extension of the depletion layer. Consequently, the electric field concentration in the end of the device adjacent to the drain electrode 52 can be alleviated.

Second Embodiment

Figure 13:
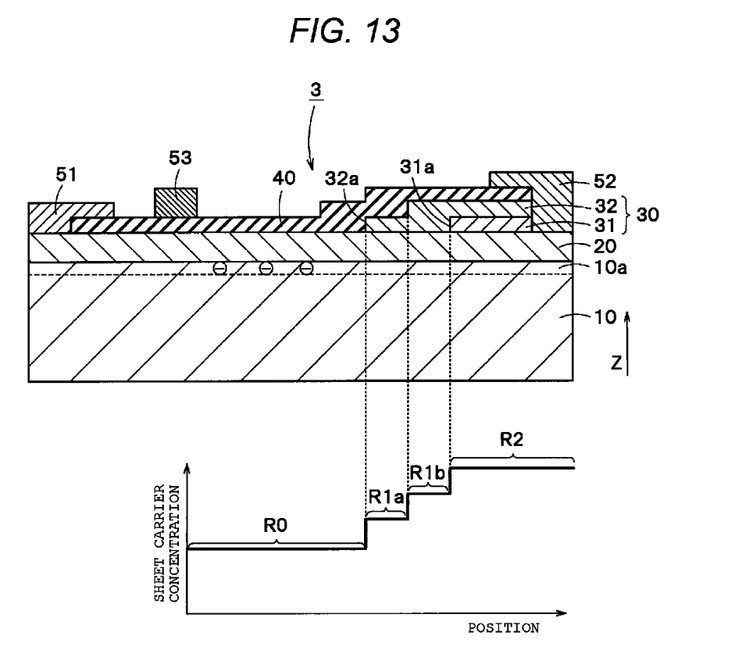
FIG. 13 is a cross-sectional diagram illustrating a schematic structure of a semiconductor device according to a second embodiment.

FIG. 13 is a cross-sectional diagram illustrating a schematic structure of a semiconductor device according to a second embodiment. The same constituent elements as those in the first embodiment are given like reference numerals, and detailed descriptions thereof are omitted.

In a semiconductor device 3 according to the present embodiment, the first nitride layer 31 and the second nitride layer 32 each include aluminum nitride (AlN). The aluminum concentration of the second nitride layer 32 is higher than the aluminum concentration of the first nitride layer 31. Furthermore, the portion 32a of the second nitride layer 32 is closer to the gate electrode 53 than the end portion 31a of the first nitride layer 31. That is, as the stacking position of a layer is higher, the end of the nitride layer 30 is closer to the gate electrode 53 than a lower layer.

With the positional relationship of the end portion as described above, a region R1a in which the thin second nitride layer 32 is provided on the nitride semiconductor layer 20, and a region R1b in which the thick second nitride layer 32 is provided on the nitride semiconductor layer 20 are present in the semiconductor device 3. As illustrated in FIG. 1, sheet carrier concentration of the region R1b is higher than sheet carrier concentration of the region R1a.

A process of manufacturing the semiconductor device 1 according to the present embodiment will be described below referring to FIGS. 14 to 19.

Figure 14:
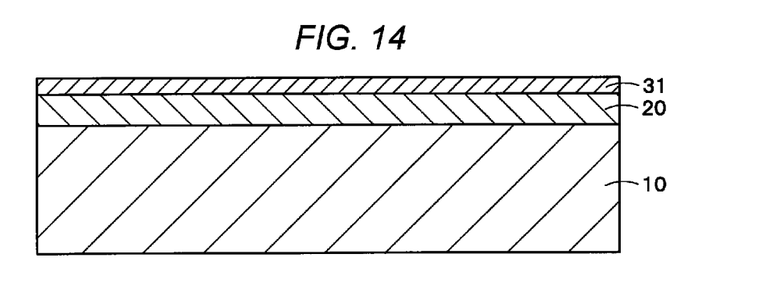
FIG. 14 is a cross-sectional diagram illustrating a process of manufacturing the semiconductor device that is illustrated in FIG. 13.

First, as illustrated in FIG. 14, the first nitride layer 31 is formed on a second nitride semiconductor 20, for example, using the PECVD method or an atomic layer deposition (ALD) method.

Figure 15:
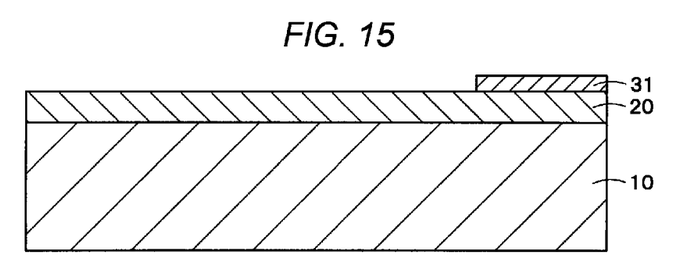
FIG. 15 is a cross-sectional diagram illustrating a manufacturing process that follows the manufacturing process which is illustrated in FIG. 14.

Next, as illustrated in FIG. 15, one portion of the first nitride layer 31 is removed, for example, by wet etching or dry etching.

Figure 16:
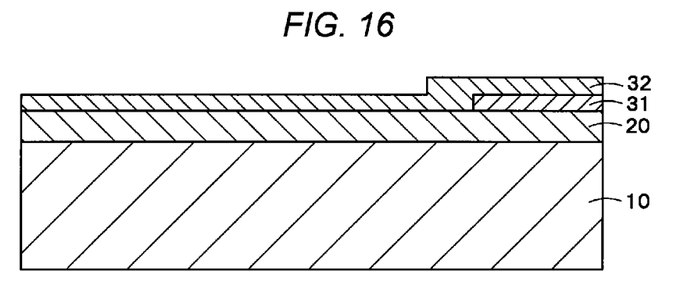
FIG. 16 is a cross-sectional diagram illustrating a manufacturing process that follows the manufacturing process which is illustrated in FIG. 15.

Thereafter, as illustrated in FIG. 16, the second nitride layer 32 is formed on the second nitride semiconductor 20 in such a manner as to cover the entire first nitride layer 31, for example, using the PECVD method or the ALD method.

Figure 17:
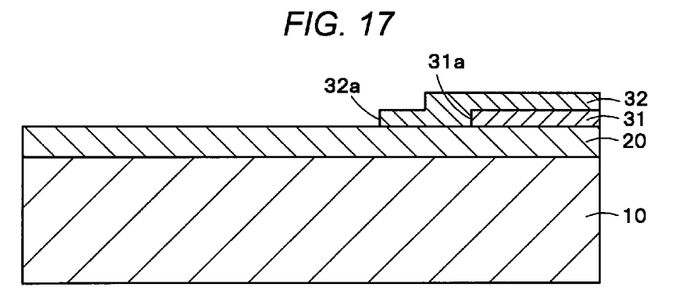
FIG. 17 is a cross-sectional diagram illustrating a manufacturing process that follows the manufacturing process which is illustrated in FIG. 16.

Thereafter, as illustrated in FIG. 17, one portion of the second nitride layer 32 is removed, for example, by wet etching or the dry etching. At this time, the second nitride layer 32 is removed in such a manner that the end 32a is disposed to the left of the end 31a in FIG. 17. That is, according to the present embodiment, after patterning of the first nitride layer 31, the second nitride layer 32 is film-formed and is patterned. For this reason, in the present embodiment, with regard to an etching stop, the second nitride layer 32 can be formed more easily than in the first embodiment.

Thereafter, in the same manner as in the first embodiment, the insulating film 40 is formed on each of the nitride semiconductor layer 20, the first nitride layer 31, and the second nitride layer 32, for example, using the PECVD method or the LPCVD method.

Figure 18:
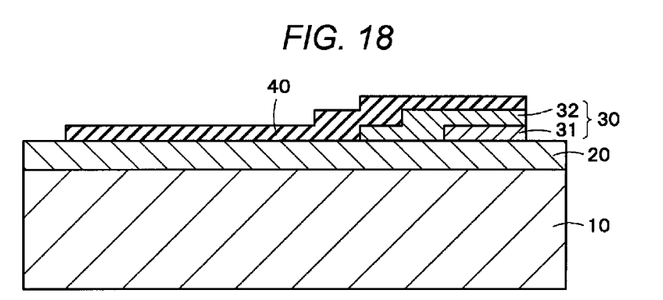
FIG. 18 is a cross-sectional diagram illustrating a manufacturing process that follows the manufacturing process which is illustrated in FIG. 17.

Thereafter, as illustrated in FIG. 18, an end portion of the insulating film 40 is removed by the wet etching or the dry wet etching. According to the present embodiment, because the first nitride layer 31 and the second nitride layer 32 are insulating layers, end portions of these are etched together with the insulating film 40 in order to secure conduction to the source electrode 51. Accordingly, opposed ends of the nitride semiconductor layer 20 is exposed.

Figure 19:
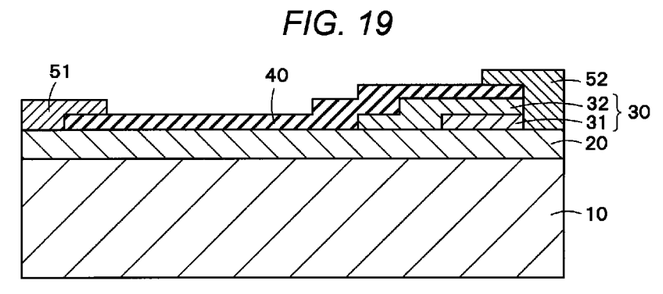
FIG. 19 is a cross-sectional diagram illustrating a manufacturing process that follows the manufacturing process which is illustrated in FIG. 18.

Thereafter, as illustrated in FIG. 19, the source electrode 51 and the drain electrode 52 are formed on the exposed portions of the nitride semiconductor layer 20. According to the present embodiment, the source electrode 51 and the drain electrode 52 come into ohmic contact with the nitride semiconductor layer 20.

Thereafter, referring back to FIG. 13, the gate electrode 53 is formed on the insulating film 40. At this time, the gate electrode 53 is disposed closer to the source electrode 51 than the end 32a of the second nitride layer 32.

According to the present embodiment described above, with the first nitride layer 31 and the second nitride layer 32, the regions R1a, R1b, and R2 that have high sheet carrier concentration of the two-dimensional electron gas 10a are formed. Accordingly, because the depletion layer has difficulty extending toward the drain electrode 52, the electric field concentration in the end portion of the device adjacent to the drain electrode 52 can be alleviated.

Moreover, the first embodiment described above may be applied to the second embodiment. That is, as illustrated in FIG. 13, the first nitride layer 31 and the second nitride layer 32 each include aluminum gallium nitride (AlGaN), and the end portion 32a may be disposed on the gate electrode 53 side than the end portion 31a. Furthermore, the second embodiment may be applied to the first embodiment. That is, as illustrated in FIG. 1, the first nitride layer 31 and the second nitride layer 32 each include aluminum nitride (AlN), and the end portion 32a may be disposed on the drain electrode 52 side than the end portion 31a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first nitride semiconductor layer;
   a second nitride semiconductor layer containing aluminum on the first nitride semiconductor layer;
   a third nitride semiconductor layer containing aluminum on the second nitride semiconductor layer;
   a fourth nitride semiconductor layer containing aluminum on the third nitride semiconductor layer;
   a source electrode on the second nitride semiconductor layer;
   a drain electrode on at least one of the second nitride semiconductor layer or the fourth nitride semiconductor layer; and
   a gate electrode between the source electrode and the drain electrode, wherein
   each of the third and fourth nitride semiconductor layers has a first end on a drain electrode side and a second end on a source electrode side, the second ends being between the gate electrode and the drain electrode and spaced from the gate electrode, and
   a distance from the second end of the third nitride semiconductor layer to the pate electrode is less than a distance from the second end of the fourth nitride semiconductor layer to the gate electrode.

2. The device according to claim 1, wherein aluminum concentration of at least one of the third and fourth nitride semiconductor layers is higher than aluminum concentration of the second nitride semiconductor layer.

3. The device according to claim 1,
wherein, aluminum concentration of the fourth nitride semiconductor layer is greater than aluminum concentration of the third nitride semiconductor layer.

4. The device according to claim 1,
wherein each of the third and fourth nitride semiconductor layers includes silicon, and
wherein, silicon concentration of the fourth nitride semiconductor layer is greater than silicon concentration of the third nitride semiconductor layer.

5. The device according to claim 1, wherein the second end of each of the third and fourth nitride semiconductor layers is tapered towards the gate electrode.

6. The device according to claim 1,
wherein the second nitride semiconductor layer and the third and fourth nitride semiconductor layers each comprise aluminum gallium nitride.

7. The device according to claim 1,
wherein the third and fourth nitride semiconductor layers comprises aluminum nitride.

8. A semiconductor device comprising:
a first nitride semiconductor layer;
a second nitride semiconductor layer on the first nitride semiconductor layer, the second nitride semiconductor layer having a band gap greater than a band gap of the first nitride semiconductor layer;
a third nitride semiconductor layer on the second nitride semiconductor layer, the third nitride semiconductor layer having a band gap greater than the band gap of the second nitride semiconductor layer;
a fourth nitride semiconductor layer on the third nitride semiconductor layer, the fourth nitride semiconductor layer having a band gap greater than the band gap of the second nitride semiconductor layer;
a source electrode on the second nitride semiconductor layer;
a drain electrode on at least one of the second nitride semiconductor layer or the fourth nitride semiconductor layer; and
a gate electrode between the source electrode and the drain electrode, wherein
each of the third and fourth nitride semiconductor layers has a first end on a drain electrode side and a second end on a source electrode side, the second ends being between the gate electrode and the drain electrode and spaced from the gate electrode, and
a distance from the second end of the third nitride semiconductor layer to the gate electrode is less than a distance from the second end of the fourth nitride semiconductor layer to the gate electrode.

9. The device according to claim 8, wherein aluminum concentration of the third nitride semiconductor layer is smaller than aluminum concentration of the fourth nitride semiconductor layer.

10. The device according to claim 8, wherein the fourth nitride semiconductor layer comprises:
a first portion overlying the third nitride semiconductor layer,
a second portion on the second nitride semiconductor layer, the second portion extending from the second end of the third nitride semiconductor layer towards the gate electrode, and
a third portion on the second nitride semiconductor layer, the third portion extending from the second portion towards the gate electrode, wherein
the second portion is thicker than the first portion and thicker than the third portion.

11. The device according to claim 8, wherein the second end of the third nitride semiconductor layer is tapered towards the gate.

12. The device according to claim 8, wherein the second nitride semiconductor layer comprises aluminum gallium nitride and the third nitride semiconductor layer comprises one of aluminum gallium nitride and aluminum nitride.

* * * * *